United States Patent
Wen-Shyong

[11] Patent Number: 5,838,540
[45] Date of Patent: Nov. 17, 1998

[54] SCANNER CASING

[76] Inventor: Chang Wen-Shyong, 58, Ma Yuan West St., Taichung, Taiwan

[21] Appl. No.: 850,306

[22] Filed: Apr. 9, 1997

[51] Int. Cl.$^6$ ....................................................... H05K 5/02
[52] U.S. Cl. ................. 361/686; 206/316.1; 248/346.03; 312/223.2
[58] Field of Search .................................... 361/683, 686; 248/346.03, 918; 206/316.1, 461, 471; 347/138, 263; 312/223.1, 223.2, 208.3; 355/84; 358/474; 235/486

[56] References Cited

U.S. PATENT DOCUMENTS

| | | | |
|---|---|---|---|
| 5,237,340 | 8/1993 | Nelson | 347/138 |
| 5,264,956 | 11/1993 | Tzu-Chin | 359/196 |
| 5,582,470 | 12/1996 | Yu | 312/208.3 |
| 5,628,575 | 5/1997 | Morikawa et al. | 312/223.1 |
| 5,660,470 | 8/1997 | Mench | 374/121 |
| 5,751,000 | 5/1998 | McCroskey et al. | 250/363.03 |
| 5,751,447 | 5/1998 | Brook et al. | 358/487 |

Primary Examiner—Gerald P. Tolin
Assistant Examiner—John B. Vigushin

[57] ABSTRACT

A scanner casing has a lower housing and an upper housing covering the lower housing. A glue material is adhered on a lower periphery edge of the lower housing. The lower housing is adhered on a scanner. Four threaded fastening portions are disposed on four upper corners of the lower housing. Each of the threaded fastening portions has a threaded hole. Four hollow fastening portions are disposed on four upper corners of the upper housing. Each threaded hole matches each corresponding hollow fastening portion to be fastened by a bolt.

2 Claims, 5 Drawing Sheets

SCANNER CASING

BACKGROUND OF THE INVENTION

The present invention relates to a scanner casing. More particularly, the present invention relates to a scanner casing which can receive a real article so that a scanner can scan the real article directly.

Referring to FIG. 4, a scanner device comprises a scanner A and an upper cover B covering the scanner A. A real article cannot be scanned by the scanner A. The real article should be photographed. Then the photograph is scanned by the scanner A. Referring to FIG. 5, an optical cover C replaces the upper cover B. A lantern slide can be scanned by the scanner A.

SUMMARY OF THE INVENTION

An object of the present invention is to provide a scanner casing which can receive a real article so that a scanner can scan the real article directly.

Accordingly, a scanner casing comprises a lower housing and an upper housing covering the lower housing. A glue material is adhered on a lower periphery edge of the lower housing. The lower housing is adhered on a scanner. Four threaded fastening portions are disposed on four upper corners of the lower housing. Each of the threaded fastening portions has a threaded hole. Four hollow fastening portions are disposed on four upper corners of the upper housing. Each threaded hole matches each corresponding hollow fastening portion to be fastened by a bolt.

DETAILED DESCRIPTION OF THE INVENTION

Figure 1:
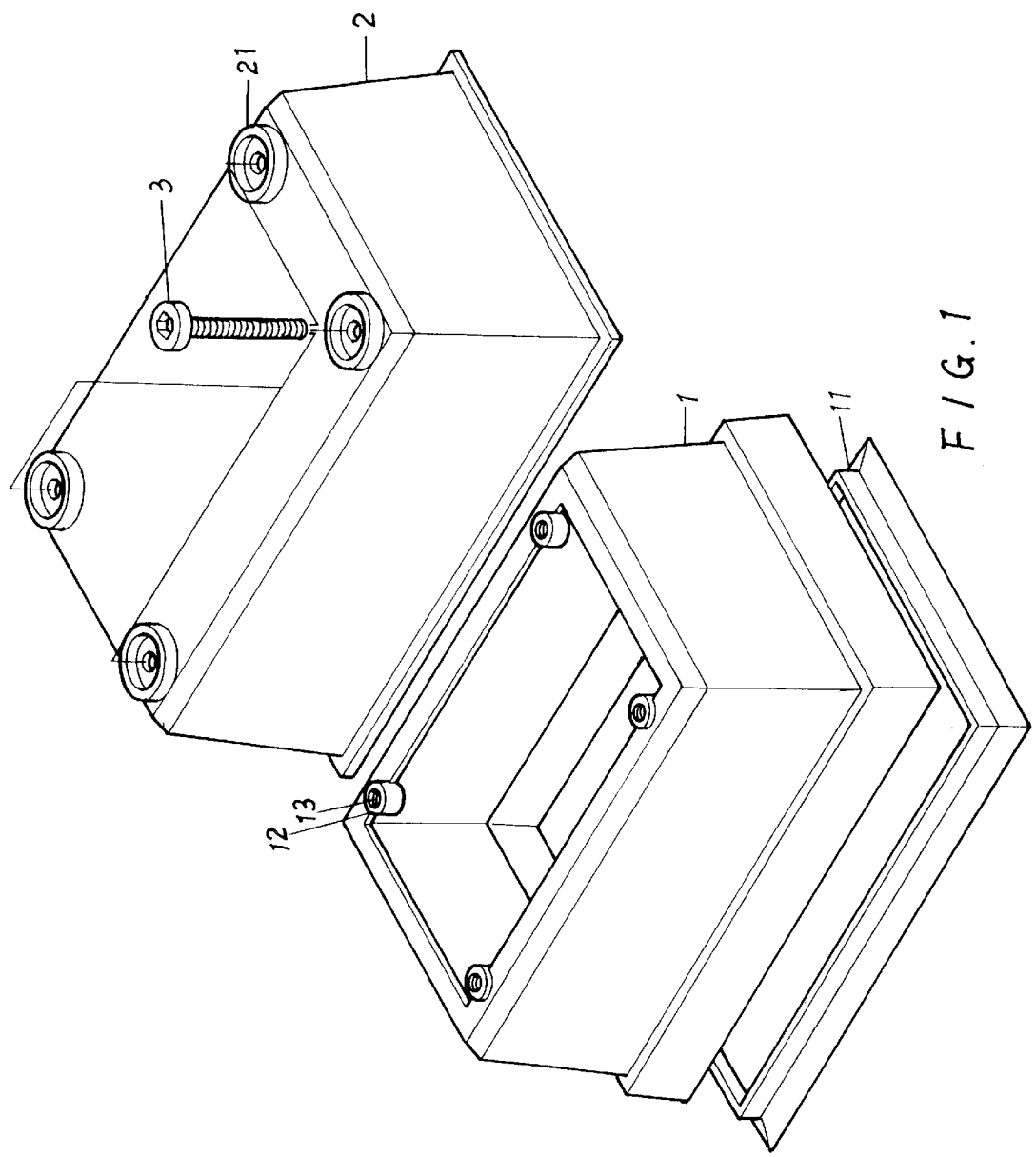
FIG. 1 is a perspective exploded view of a scanner casing of a preferred embodiment in accordance with the present invention.
Figure 2:
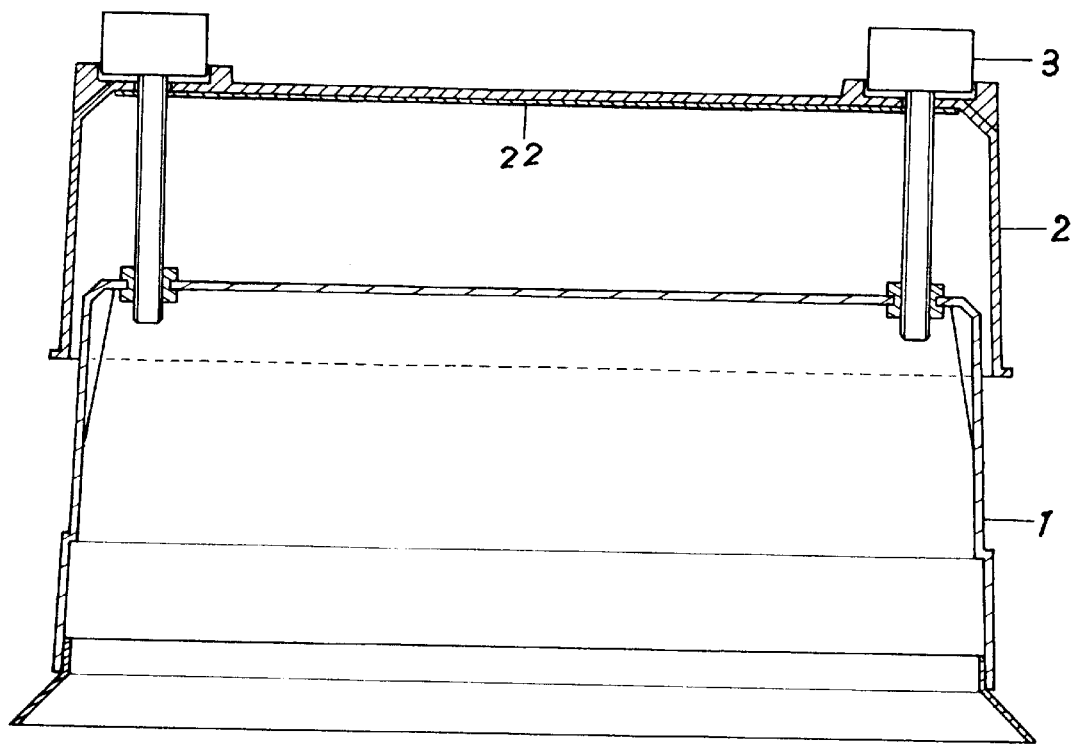
FIG. 2 is a sectional view of a scanner casing of a preferred embodiment in accordance with the present invention.
Figure 3:
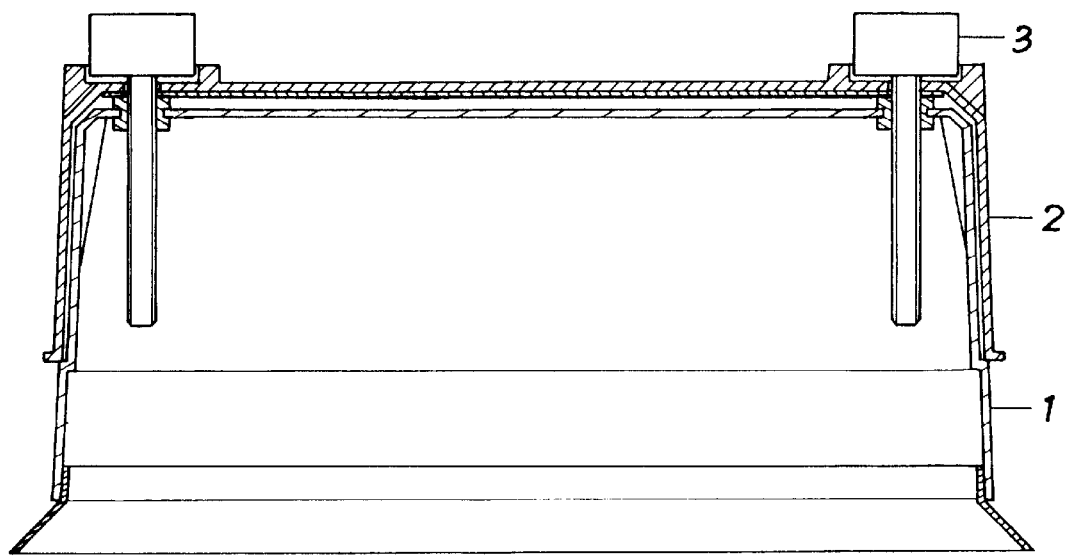
FIG. 3 is another sectional view of a scanner casing of a preferred embodiment in accordance with the present invention.
Figure 4:
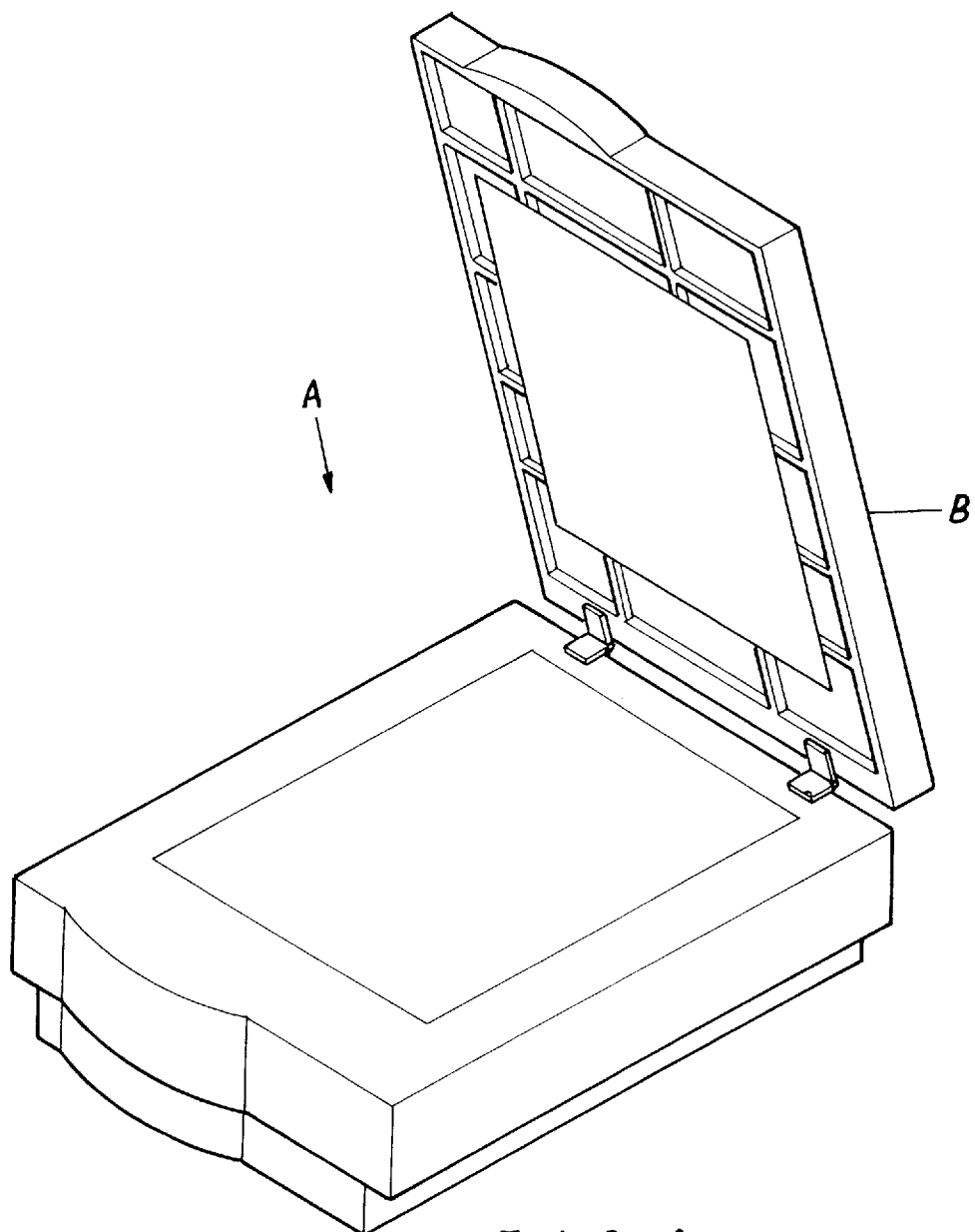
FIG. 4 is a perspective view of a scanner device of a first prior art.
Figure 5:
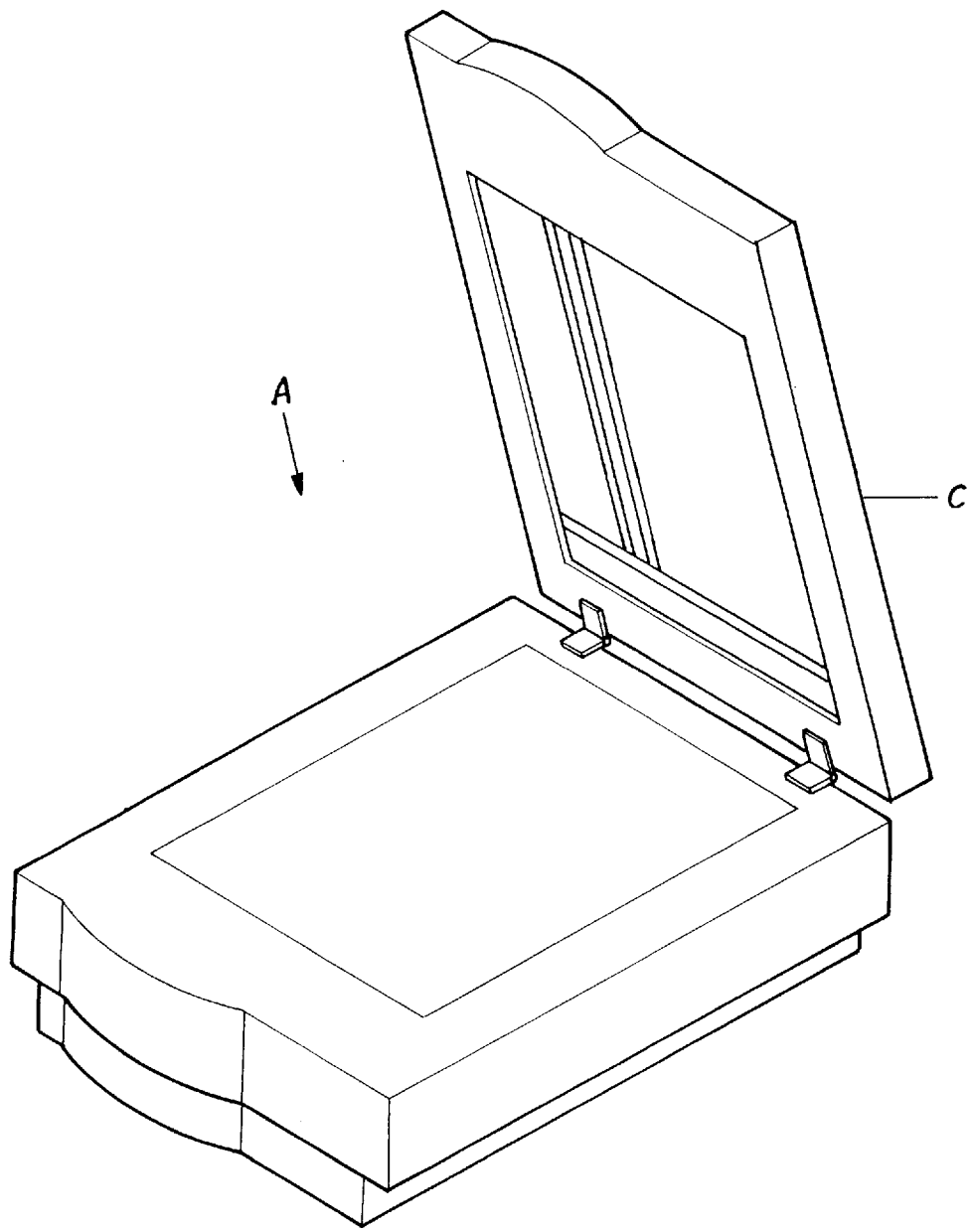
FIG. 5 is a perspective view of a scanner device of a second prior art.

Referring to FIGS. 1 to 3, a scanner casing comprises a lower housing 1 and an upper housing 2 covering the lower housing 1. A glue material is adhered on a lower periphery edge of the lower housing 1. The lower housing 1 is adhered on a scanner (not shown in the figures). Four threaded fastening portions 12 are disposed on four upper corners of the lower housing 1. Each of the threaded fastening portions 12 has a threaded hole 13. Four hollow fastening portions 21 are disposed on four upper corners of the upper housing 2. Each threaded hole 13 matches each corresponding hollow fastening portion 21 to be fastened by a bolt 3. A paperboard 22 is disposed on an inner face of the upper housing 2.

A real article is placed on the scanner and enclosed by the lower housing 1 and the upper housing 2. As shown in FIG. 2, the bolt 3 can be screwed tightly if the real article is short. As shown in FIG. 3, the bolt 3 can be adjusted if the real article is tall.

The invention is not limited to the above embodiment but various modification thereof may be made. Further, various changes in form and detail may be made without departing from the scope of the invention.

I claim:

1. A scanner casing comprising:

a lower housing and an upper housing covering the lower housing, a glue material adhered on a lower periphery edge of said lower housing, said lower housing adhered on a scanner, four threaded fastening portions disposed on four upper corners of said lower housing, each said threaded fastening portion having a threaded hole, four hollow fastening portions disposed on four upper corners of said upper housing, each said threaded hole matching each said corresponding hollow fastening portion to be fastened by a bolt.

2. A scanner casing as claimed in claim 1, wherein a paperboard is disposed on an inner face of the upper housing.

\* \* \* \* \*